United States Patent
Sim et al.

(10) Patent No.: US 10,074,773 B2
(45) Date of Patent: Sep. 11, 2018

(54) SEMICONDUCTOR LIGHT EMITTING DEVICE AND METHOD OF MANUFACTURING THE SAME

(71) Applicant: SAMSUNG ELECTRONICS CO., LTD., Suwon-si, Gyeonggi-do (KR)

(72) Inventors: Jae In Sim, Yongin-si (KR); Ju Heon Yoon, Seoul (KR); Gi Bum Kim, Yongin-si (KR); Ji Hye Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/671,275

(22) Filed: Aug. 8, 2017

(65) Prior Publication Data

US 2018/0198025 A1 Jul. 12, 2018

(30) Foreign Application Priority Data

Jan. 10, 2017 (KR) ........................ 10-2017-0003578

(51) Int. Cl.
*H01L 33/36* (2010.01)
*H01L 33/22* (2010.01)
(Continued)

(52) U.S. Cl.
CPC .......... *H01L 33/22* (2013.01); *H01L 21/0237* (2013.01); *H01L 21/0243* (2013.01);
(Continued)

(58) Field of Classification Search
CPC .............. H01L 33/22; H01L 21/02488; H01L 21/0237; H01L 33/38; H01L 33/007;
(Continued)

(56) References Cited

U.S. PATENT DOCUMENTS 8,124,999 B2    2/2012  Yahata et al.
2011/0220942 A1*  9/2011  Choi ........................ H01L 33/32
                                                              257/98
(Continued)

FOREIGN PATENT DOCUMENTS

JP      2015-043467     3/2015
JP      2016-063052     4/2016
(Continued)

OTHER PUBLICATIONS

Machine translation KR20080082101.*

*Primary Examiner* — Sonya D McCall Shepard
(74) *Attorney, Agent, or Firm* — F. Chau & Associates, LLC

(57) ABSTRACT

A semiconductor light emitting device includes a light emitting structure in which a first conductive semiconductor layer, an active layer, and a second conductive semiconductor layer are sequentially laminated, an insulating layer disposed on the light emitting structure and including first and second openings, an electrode layer disposed on the insulating layer and including first and second electrodes, and an adhesive layer disposed between the electrode layer and the insulating layer and including first and second openings. The first opening of the adhesive layer overlaps the first opening of the insulating layer and is equal to or larger than the first opening of the insulating layer. The second opening of the adhesive layer overlaps the second opening of the insulating layer and is equal to or larger than the second opening of the insulating layer.

20 Claims, 14 Drawing Sheets

(51) Int. Cl.
*H01L 21/02* (2006.01)
*H01L 33/00* (2010.01)
*H01L 33/38* (2010.01)
*H01L 33/42* (2010.01)

(52) U.S. Cl.
CPC .. *H01L 21/02458* (2013.01); *H01L 21/02488* (2013.01); *H01L 21/02502* (2013.01); *H01L 21/02521* (2013.01); *H01L 33/007* (2013.01); *H01L 33/38* (2013.01); *H01L 33/42* (2013.01); *H01L 2224/05001* (2013.01); *H01L 2933/0016* (2013.01)

(58) Field of Classification Search
CPC ........... H01L 21/02502; H01L 21/0243; H01L 21/02458; H01L 21/02521; H01L 33/42; H01L 2933/0016; H01L 2224/05001
See application file for complete search history.

(56) References Cited

U.S. PATENT DOCUMENTS

| | | |
|---|---|---|
| 2015/0372208 A1 | 12/2015 | Chae et al. |
| 2016/0218262 A1* | 7/2016 | Aketa .................... H01L 24/14 |

FOREIGN PATENT DOCUMENTS

| | | |
|---|---|---|
| KR | 10-2013-0065451 | 6/2013 |
| KR | 10-2016-0028086 | 3/2016 |
| KR | 10-2016-0115309 | 10/2016 |
| KR | 10-2016-0117682 | 10/2016 |

* cited by examiner

SEMICONDUCTOR LIGHT EMITTING DEVICE AND METHOD OF MANUFACTURING THE SAME

CROSS-REFERENCE TO RELATED APPLICATION

This application claims priority under 35 U.S.C. § 119 to Korean Patent Application No. 10-2017-0003578, filed in the Korean Intellectual Property Office on Jan. 10, 2017, the disclosure of which is incorporated by reference herein in its entirety.

TECHNICAL FIELD

The inventive concept relates to a light emitting device, and more particularly, to a semiconductor light emitting device and a method of manufacturing the same.

DISCUSSION OF THE RELATED ART

A semiconductor light emitting device is a semiconductor device capable of generating light by recombination of electrons and holes in a junction portion of p-type and n-type semiconductors when a current is applied. The semiconductor light emitting device has various attractive features such as a relatively long life, low power consumption, good initial driving characteristics, and a high vibration resistance when compared to an incandescent light emitting device. Thus, demand for semiconductor light emitting devices is increasing. One example of a semiconductor light emitting device includes a III-group nitride semiconductor, which is capable of emitting bluish light in a short wavelength region.

Light emission efficiency in the semiconductor light emitting device may be determined by considering an internal quantum efficiency and a light extraction efficiency. The internal quantum efficiency is determined by a quality of a semiconductor, a structure of the light emitting device and current injection efficiency. The light extraction efficiency is determined by a ratio of discharge of generated light to the outside of a semiconductor layer. Thus, two semiconductor light emitting devices having the same internal quantum efficiency may have different light emission efficiencies, depending on their respective light extraction efficiency.

One of the obstructive factors in discharging light to the outside of the semiconductor light emitting device is total internal reflection. Total internal reflection occurs on an interface between layers having different refractive indexes between respective layers of the semiconductor light emitting device, and only a part of the generated light is discharged to the outside of the semiconductor light emitting device. Further, light which fails to be discharged from the semiconductor light emitting device generates heat while moving internally. The generated heat may decrease the life of the device.

A semiconductor light emitting device may have a flip chip bonding structure, in which the light emitting device is inverted so that a substrate faces in an upward direction. A reflective layer may be provided on a rear surface of the substrate and generated light may be discharged toward the substrate. However, during a process, light generated in an active layer may be affected by a refractive index of each layer such that the light fails to be totally extracted. Thus, light emission efficiency may be decreased.

SUMMARY

According to an exemplary embodiment of the inventive concept, a semiconductor light emitting device includes a light emitting structure in which a first conductive semiconductor layer, an active layer, and a second conductive semiconductor layer are sequentially laminated, an insulating layer disposed on the light emitting structure, the insulating layer including a first opening and a second opening, an electrode layer disposed on the insulating layer, the electrode layer including a first electrode and a second electrode, and an adhesive layer disposed between the electrode layer and the insulating layer. The adhesive layer includes a first opening and a second opening. The first opening of the adhesive layer overlaps the first opening of the insulating layer, and a width of the first opening of the adhesive layer is equal to or larger than a width of the first opening of the insulating layer. The second opening of the adhesive layer overlaps the second opening of the insulating layer, and a width of the second opening of the adhesive layer is equal to or larger than a width of the second opening of the insulating layer.

According to an exemplary embodiment of the inventive concept, a method of manufacturing a semiconductor light emitting device includes forming a light emitting structure by sequentially laminating a first conductive semiconductor layer, an active layer and a second conductive semiconductor layer, etching a part of the light emitting structure such that the first conductive semiconductor layer is exposed, forming an insulating layer on the light emitting structure, forming an adhesive layer on the insulating layer, forming a first opening in the insulating layer, a second opening in the insulating layer, a first opening in the adhesive layer and a second opening in the adhesive layer by simultaneously etching the insulating layer and the adhesive layer, and forming an electrode layer on the adhesive layer, the electrode layer including a first electrode and a second electrode.

According to an exemplary embodiment of the inventive concept, a semiconductor light emitting device includes a first conductive semiconductor layer, an active layer, and a second conductive semiconductor layer stacked on each other, an electrode layer disposed on the second conductive semiconductor layer, the electrode layer including a first electrode and a second electrode, wherein the first and second electrodes are spaced apart from each other, an insulating layer disposed between the second conductive semiconductor layer and the electrode layer, wherein the insulating layer includes a first opening and a second opening, and an adhesive layer disposed between the electrode layer and the insulating layer, wherein the adhesive layer includes a first opening and a second opening. The first opening of the adhesive layer overlaps the first opening of the insulating layer. The second opening of the adhesive layer overlaps the second opening of the insulating layer. The second insulating layer has a refractive index that is lower than a refractive index of the second conductive semiconductor layer.

BRIEF DESCRIPTION OF THE DRAWINGS

The above and other features of the inventive concept will become more apparent by describing in detail exemplary embodiments thereof in conjunction with the accompanying drawings, in which.

DETAILED DESCRIPTION OF THE EMBODIMENTS

Exemplary embodiments of the inventive concept will now be described in detail with reference to the accompanying drawings.

Figure 1:
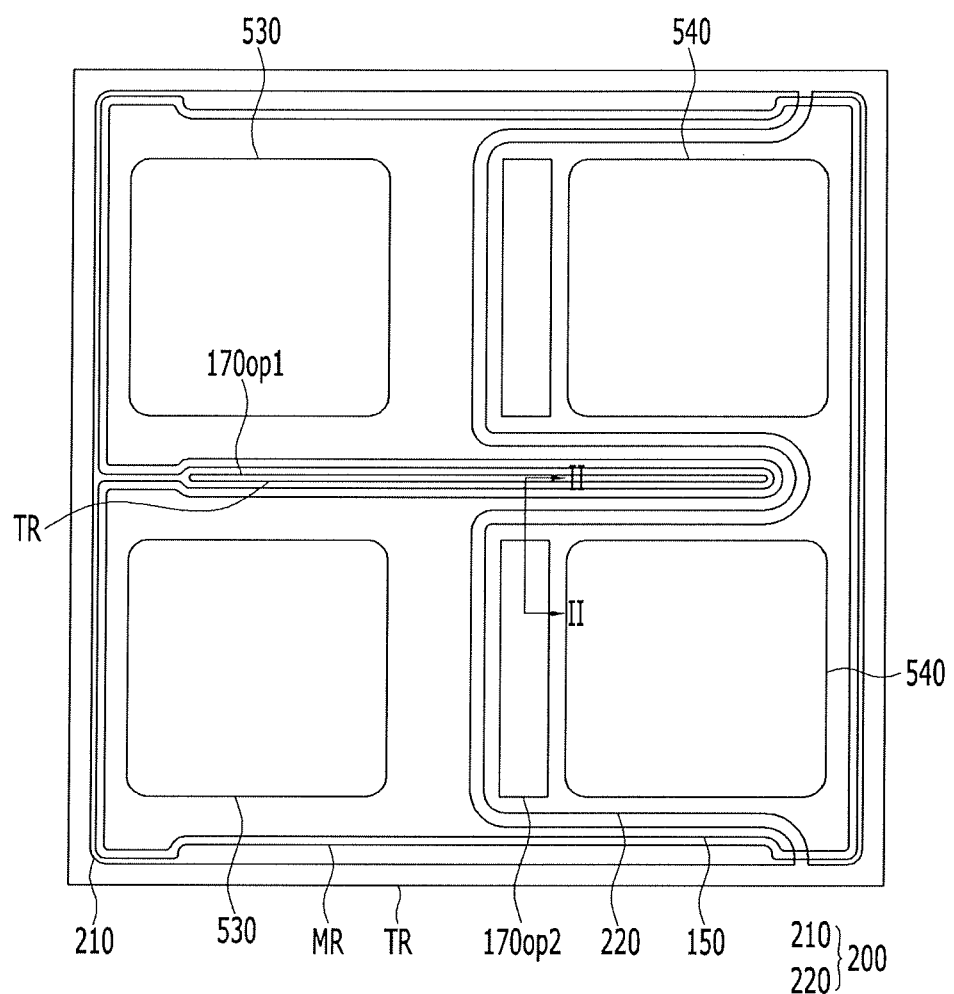
FIG. 1 is a top plan view illustrating a semiconductor light emitting device according to an exemplary embodiment of the inventive concept.
Figure 2:
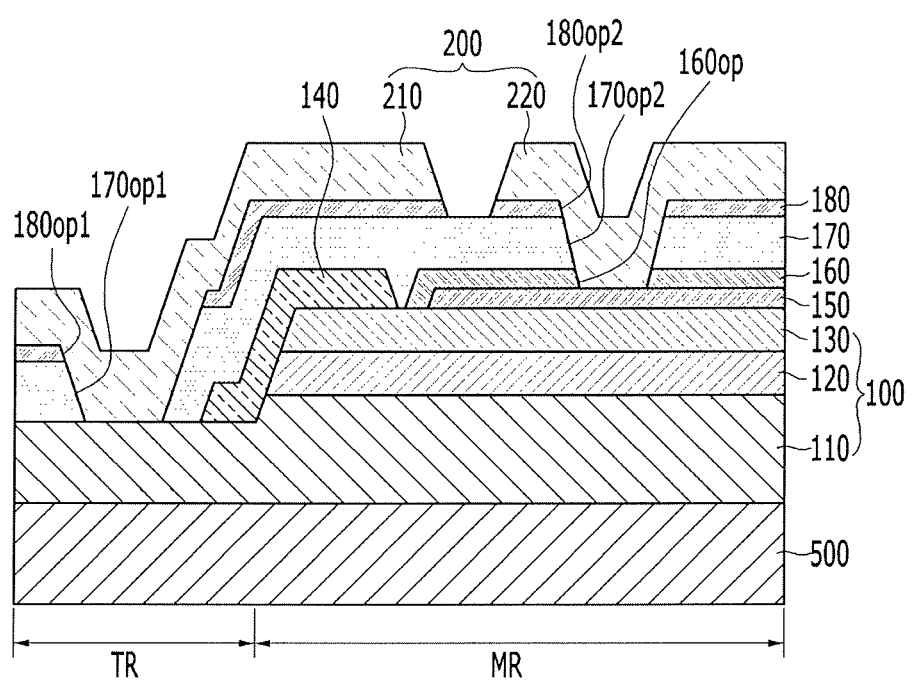
FIG. 2 is a cross-sectional view, taken along line II-II of FIG. 1, illustrating the semiconductor light emitting device of FIG. 1, according to an exemplary embodiment of the inventive concept.

FIG. 1 is a top plan view illustrating a semiconductor light emitting device according to an exemplary embodiment of the inventive concept. FIG. 2 is a cross-sectional view, taken along line II-II of FIG. 1, illustrating the semiconductor light emitting device of FIG. 1, according to an exemplary embodiment of the inventive concept.

Referring to FIGS. 1 and 2, a semiconductor light emitting device includes a substrate 500 and a light emitting structure 100 formed on the substrate 500. The light emitting structure 100 may include a first conductive semiconductor layer 110, an active layer 120 disposed on the first conductive semiconductor layer 110, and a second conductive semiconductor layer 130 disposed on the active layer 120.

The substrate 500 may be a transparent substrate. For example, the substrate 500 may include sapphire ($Al_2O_3$), gallium nitride (GaN), silicon carbide (SiC), gallium oxide ($Ga_2O_3$), lithium-gallium oxide ($LiGaO_2$), lithium-aluminum oxide ($LiAlO_2$), and/or magnesium-aluminum oxide ($MgAl_2O_4$). However, in an exemplary embodiment of the inventive concept, the substrate 500 may be omitted.

The first conductive semiconductor layer 110 may be an n-type semiconductor layer, and the second conductive semiconductor layer 130 may be a p-type semiconductor layer. Further, the first conductive semiconductor layer 110 and the second conductive semiconductor layer 130 may each include a nitride semiconductor. The first conductive semiconductor layer 110 and the second conductive semiconductor layer 130 may have an empirical formula $Al_xIn_yGa_{(1-x-y)}N$ (herein, $0 \leq x \leq 1$, $0 \leq y \leq 1$, $0 \leq x+y \leq 1$). The first conductive semiconductor layer 110 and the second conductive semiconductor layer 130 may each include GaN, AlGaN and/or InGaN. In an exemplary embodiment of the inventive concept, the first conductive semiconductor layer 110 may include an n-type doped nitride semiconductor material, and the second conductive semiconductor layer 130 may include a p-type doped nitride semiconductor material. For example, the first conductive semiconductor layer 110 may include n-type doped GaN, and the second conductive semiconductor layer 130 may include p-type doped GaN.

The active layer 120 may emit light having a predetermined energy by a recombination of electrons and holes. The active hole layer 120 may have a multiple quantum well (MQW) structure, in which quantum well layers and quantum barrier layers are alternately laminated on each other. The multiple quantum well structure may have an InGaN/GaN structure. The first conductive semiconductor layer 110, the active layer 120, and the second conductive semiconductor layer 130 may be epitaxial layers.

In an exemplary embodiment of the inventive concept, the light emitting structure 100 may be formed by using a metal-organic chemical vapor deposition (MOCVD) process, a hydride vapor phase epitaxy (HVPE) process, a molecular beam epitaxy (MBE) process, or the like.

A nitride semiconductor thin film may be disposed between the substrate 500 and the light emitting structure 100. The nitride semiconductor thin film may serve as a buffer layer for relieving a lattice mismatch between the substrate 500 and the first conductive semiconductor layer 110.

The light emitting structure 100 may include a plurality of trench regions TR and a plurality of mesa regions MR. The mesa regions MR may be partially divided by the trench regions TR. The trench regions TR may be formed by etching parts of the second conductive semiconductor layer 130, the active layer 120 and the first conductive semiconductor layer 110.

A first insulating layer 140 may be disposed at a boundary between each mesa region MR and trench region TR. The first insulating layer 140 may cover a lateral surface of the light emitting structure 100 exposed at the boundary between each mesa region MR and trench region TR.

A conductive layer 150 is disposed on the second conductive semiconductor layer 130. The conductive layer 150 may cover the light emitting structure 100. The conductive layer 150 may be disposed only inside the mesa region MR, and may not be disposed on the trench region TR.

The conductive layer 150 may be connected with a second electrode 220, as described below. A current supplied from the second electrode 220 may be diffused in a direction substantially parallel to an upper surface of the light emitting structure 100 through the conductive layer 150. The current that is diffused by the conductive layer 150 may be supplied to the second conductive semiconductor layer 130. The conductive layer 150 may prevent the current from being concentrated in a specific region when being in contact with the second conductive semiconductor layer 130 over a relatively large area. Accordingly, a light efficiency of the semiconductor light emitting device may be increased.

The conductive layer 150 may include indium tin oxide (ITO), aluminum zinc oxide (AZO), indium zinc oxide (IZO), ZnO, GZO (ZnO:Ga), $In_2O_3$, $SnO_2$, CdO, $CdSnO_4$ and/or $Ga_2O_3$. Further, the conductive layer 150 may include Ag, Al, Ni, Au, Ag, Ti, Cr, Pd, Cu, Pt, Sn, W, Rh, Ir, Ru, Mg, and/or Zn, and/or an alloy including at least one metal. When the conductive layer 150 includes a metal, the light generated in the active layer 120 may be reflected toward the substrate 500 by the conductive layer 150. When the conductive layer 150 includes a transparent conductive oxide, such as ITO, the light generated in the active layer 120 may be reflected from the second electrode 220.

A capping layer 160 may be disposed on the conductive layer 150. The capping layer 160 may overlap the entire conductive layer 150, and a part of the capping layer 160 may also be in contact with the second conductive semiconductor layer 130. The capping layer 160 may include an oxide, such as $SiO_2$ or $TiO_2$. In addition, or alternatively, the capping layer 160 may include a metal.

An attachment characteristic between the conductive layer 150 and the second conductive semiconductor layer 130 may be poor depending on a material included in the conductive layer 150. For example, when the conductive layer 150 includes Ag, and the second conductive semiconductor layer 130 includes GaN, an attachment characteristic between both materials is poor. Thus, the conductive layer 150 may peel off from the second conductive semiconductor layer 130. However, the capping layer 160 includes a material having a good attachment characteristic with the material(s) included in the second conductive semiconductor layer 130. Thus, the conductive layer 150 may not be peeled off from an upper surface of the second conductive semiconductor layer 130 at least due to the adhesion between the capping layer 160 and the second conductive semiconductor layer 130. Since the capping layer 160 covers a front surface and a lateral surface of the conductive layer 150, the conductive layer 150 is not easily peeled off. However, the capping layer 160 may be omitted depending on a material included in the conductive layer 150. When the capping layer 160 includes an insulating material, such as an oxide, the capping layer 160 may have an opening 160op exposing a part of the conductive layer 150. However, when the capping layer 160 includes metal, the opening 160op of the capping layer 160 may be omitted.

A second insulating layer 170 is disposed on the capping layer 160. The second insulating layer 170 may be formed by using a plasma-enhanced chemical vapor deposition (PECVD), physical vapor deposition (PVD), chemical vapor deposition (CVD), or spin coating.

The second insulating layer 170 may include an insulating material having a lower refractive index than a refractive index of the second conductive semiconductor layer 130. For example, the second insulating layer 170 may include silicon dioxide ($SiO_2$), silicon nitride ($Si_3N_4$) and/or magnesium fluoride ($MgF_2$).

The second insulating layer 170 may be disposed in both the mesa region MR and the trench region TR. Accordingly, the light generated in the light emitting structure 100 may be reflected with a high reflectivity in the mesa region MR, and the light emitted from the lateral surface of the light emitting structure 100 may also be reflected with a high reflectivity in the lateral surface of the mesa region MR and the trench region TR.

The second insulating layer 170 may have a thickness of about 500 nm to about 700 nm.

The second insulating layer 170 may include a first opening 170op1 and a second opening 170op2. The first opening 170op1 may be disposed in the trench region TR, and may expose the first conductive semiconductor layer 110. The second opening 170op2 may be disposed in the mesa region MR and may expose the conductive layer 150. The second opening 170op2 of the second insulating layer 170 may overlap the opening 160op of the capping layer 160. The second opening 170op2 of the second insulating layer 170 may be formed with the opening 160op of the capping layer 160 by using a single process, and the borders of the openings 160op and 170op2 may be substantially aligned.

A first electrode 210 and the first conductive semiconductor layer 110 are connected with each other through the first opening 170op1 of the second insulating layer 170, so that a voltage may be applied to the first conductive semiconductor layer 110. A second electrode 220 and the second conductive semiconductor layer 130 are connected with each other through the second opening 170op2 of the second insulating layer 170, so that a voltage may be applied to the second conductive semiconductor layer 130.

An adhesive layer 180 is disposed on the second insulating layer 170. The adhesive layer 180 may be disposed only on an upper surface of the second insulating layer 170, and may not be disposed at internal sides and lateral surfaces of the first opening 170op1 and the second opening 170op2 of the second insulating layer 170. For example, the adhesive layer 180 may not be disposed on a lateral wall or a bottom surface of the first opening 170op1 of the second insulating layer 170, and may not be disposed on a lateral wall or a bottom surface of the second opening 170op2.

The adhesive layer 180 has a first opening 180op1 corresponding to the first opening 170op1 of the second insulating layer 170, and a second opening 180op2 corresponding to the second opening 170op2 of the second insulating layer 170.

A width of the first opening 180op1 of the adhesive layer 180 may be the same as or larger than a width of the first opening 170op1 of the second insulating layer 170. This may be because the first opening 170op1 of the second insulating layer 170 and the opening 180op1 of the adhesive layer 180 are formed by a single process after the second insulating layer 170 and the adhesive layer 180 are laminated on a front surface of the substrate 500. The opening in an upper layer (e.g., the first opening 180op1) among the laminated layers (e.g., the adhesive layer 180 and the second insulating layer 170) may be formed to be wider than the opening in a lower layer (e.g., the second insulating layer 170) among the laminated layers during a process of forming the openings. In addition, a width of the second opening 180op2 of the adhesive layer 180 may be the same as or larger than a width of the second opening 170op2 of the second insulating layer 170.

In an exemplary embodiment of the inventive concept, the adhesive layer 180 has a thin film structure having a predetermined thickness as illustrated in FIG. 2. Otherwise, the adhesive layer 180 may have a structure including a plurality of patterns, which are spaced apart from one another in an island shape.

When the first electrode 210 and the second electrode 220 are formed on the second insulating layer 170, adhesive force between the first electrode 210 and the second electrode 220 and the second insulating layer 170 becomes weak, and the first electrode 210 and the second electrode 220 may be peeled off from the second insulating layer 170. When the first electrode 210 and the second electrode 220 are peeled off, an electric connection of the first electrode 210 and the second electrode 220 may become unstable, and an operation voltage may be increased.

However, when the adhesive layer 180 is formed on the second insulating layer 170, the first electrode 210 and the second electrode 220 may not be peeled off from the second insulating layer 170 due to the adhesion of the adhesive layer 180. Accordingly, the first electrode 210 and the second electrode 220 may be stably connected with the light emitting structure 100. As a result, an operation voltage may be prevented from increasing and the reliability of the semiconductor light emitting device may be increased.

The adhesive layer 180 may include a transparent conductive oxide, a metal, or an insulating material. In an exemplary embodiment of the inventive concept, the adhesive layer 180 is disposed on the second insulating layer 170, and is not disposed at the inner sides of the first opening 170op1 and the second opening 170op2 of the second insulating layer 170. The first electrode 210 is in contact with the first conductive semiconductor layer 110 in the first opening 170op1, and the second electrode 220 is in contact with the conductive layer 150 in the second opening 170op2. The adhesive layer 180 may not be disposed at the inner sides of the first opening 170op1 and the second opening 170op2, through which voltage passes, so that the adhesive layer 180 is not limited to being a conductive material. For example, an insulating material may be used as the adhesive layer 180.

When the adhesive layer 180 includes an insulating material, the adhesive layer 180 may include an insulating material having a lower refractive index than a refractive index of the second insulating layer 170.

Accordingly, the adhesive layer 180 may form a high reflective region by a difference in a refractive index with the second insulating layer 170, and may reflect the light generated from the light emitting structure 100 with a high reflectivity. For example, the adhesive layer 180, which includes an insulating material, may increase the reflectivity of light in the semiconductor light emitting device having a flip-chip structure together with the second insulating layer 170.

When the adhesive layer 180 is a transparent conductive oxide or a metal, light is absorbed in the adhesive layer 180. Thus, the light extraction efficiency of the semiconductor light emitting device may be decreased. However, when the adhesive layer 180 includes an insulating material, light absorption by the adhesive layer 180 may be decreased. For example, the adhesive layer 180 may include an oxide, for example, $SiO_2$ or $TiO_2$. Further, when the second insulating layer 170 includes $SiO_2$, the adhesive layer 180 may include $TiO_2$. This may be because an attachment characteristic between the second insulating layer 170 including $SiO_2$ and Ag, that is usable as an electrode layer, is poor, but when the adhesive layer 180 uses $TiO_2$, $TiO_2$ may increase the attachment characteristic (e.g., the adherence) between $SiO_2$ and Ag.

Further, in the case where the adhesive layer 180 is a metal, the adhesive layer 180 needs to be formed to have a thickness of about 10 Å or less, due to electrical resistance. When the adhesive layer 180 is a transparent conductive oxide, such as ITO, the adhesive layer 180 needs to be formed to have a thickness of about 100 Å or less. This may be because light is absorbed by a metal or a transparent conductive oxide. However, when the adhesive layer 180 includes an insulating material, the adhesive layer 180 may be formed to be thick. For example, a thickness of the adhesive layer 180 may be about 1 to about 1,000 Å.

An electrode layer 200 including the first electrode 210 and the second electrode 220 is disposed on the adhesive layer 180. The first electrode 210 and the second electrode 220 are separated from each other, and are not in contact with each other.

The first electrode 210 is disposed at the inner side of the first opening 170op1 of the second insulating layer 170, and on the second insulating layer 170. The first electrode 210 may be in contact with the first conductive semiconductor layer 110 through the first opening 170op1 of the second insulating layer 170, and may supply a voltage to the first conductive semiconductor layer 110.

Since the adhesive layer 180 is not disposed at the inner side of the first opening 170op1 of the second insulating layer 170, the first electrode 210 is in contact with the second insulating layer 170 on the lateral surface of the first opening 170op1 of the second insulating layer 170. For example, an entire surface of a lateral wall of the first opening 170op1 of the second insulating layer 170 may be in contact with the first electrode 210.

The second electrode 220 is disposed at the inner side of the second opening 170op2 of the second insulating layer 170, and on the second insulating layer 170. The second electrode 220 is in contact with the conductive layer 150 through the first opening 170op2 of the second insulating layer 170, and the conductive layer 150 is in contact with the second conductive semiconductor layer 130. Thus, the second electrode 220 may supply a voltage to the second conductive semiconductor layer 130. Since the adhesive layer 180 is not disposed at the inner side of the second opening 170op2 of the second insulating layer 170, the second electrode 220 is in contact with the second insulating layer 170 on the lateral surface of the second opening 170op2 of the second insulating layer 170. For example, the entire surface of a lateral wall of the second opening 170op2 of the second insulating layer 170 may be in contact with the second electrode 220.

The first electrode 210 may serve to reflect light emitted from the light emitting structure 100. For example, the light emitted from the lateral surface of the light emitting structure 100 to the trench region TR may be reflected by the first electrode 210. The second electrode 220 may reflect the light emitted from the light emitting structure 100, and may reflect the light emitted by the light emitting structure 100 within the mesa region MR. However, when the conductive layer 150 includes a metal, light may also be reflected by the conductive layer 150 in the mesa region MR.

The first electrode 210 and the second electrode 220 may include a metal or an alloy having high reflectivity in a wavelength range of the light emitted by the light emitting structure 100. Each of the first electrode 210 and the second electrode 220 may include a single layer including a single material selected from Au, Sn, Ni, Pb, Ag, In, Cr, Ge, Si, Ti, W and Pt or an alloy including two or more materials selected from Au, Sn, Ni, Pb, Ag, In, Cr, Ge, Si, Ti, W and Pt. In addition, each of the first electrode 210 and the second electrode 220 may include multiple layers including a combination of Au, Sn, Ni, Pb, Ag, In, Cr, Ge, Si, Ti, W and Pt.

Referring to FIG. 1, a first metal layer 530 may be disposed on the first electrode 210, and a second metal layer 540 may be disposed on the second electrode 220. The first metal layer 530 and the second metal layer 540 may be electrically insulated from each other. The first metal layer 530 is connected with the first electrode 210, and the second metal layer 540 is connected with the second electrode 220. Each of the first metal layer 530 and the second metal layer 540 may serve as an external terminal of the semiconductor light emitting structure 100. For example, the voltage supplied to the first electrode layer 530 is supplied to the first conductive semiconductor layer 110 through the first electrode 210, and the voltage supplied to the second electrode layer 540 is supplied to the second conductive semiconductor layer 130 through the second electrode 220 and the conductive layer 150.

As described above, in a semiconductor light emitting device according to an exemplary embodiment of the inventive concept, the adhesive layer 180 is disposed between the second insulating layer 170 and the electrode layer 200, so that the adhesive layer 180 increases an adherence between the second insulating layer 170 and the electrode layer 200. Further, the adhesive layer 180, according to an exemplary embodiment of the inventive concept, is not formed inside the opening of the second insulating layer 170, but is formed only on the upper surface of the second insulating layer 170. Accordingly, an insulating material and/or a conductive material may be included in the adhesive layer 180, and the adhesive layer 180 may form a high reflective region together with the second insulating layer 170. When the adhesive layer 180 includes an insulating material, light absorption by the adhesive layer 180 may be decreased. Thus, the light extraction efficiency of the semiconductor light emitting device may be increased.

Figure 3:
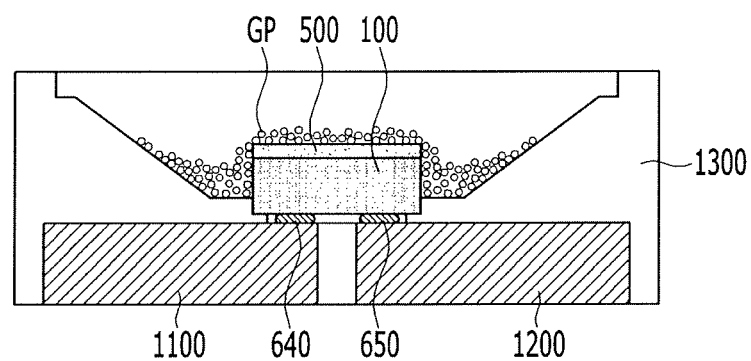
FIG. 3 is a cross-sectional view illustrating a semiconductor light emitting device package according to an exemplary embodiment of the inventive concept.

FIG. 3 is a cross-sectional view illustrating a semiconductor light emitting device package according to an exemplary embodiment of the inventive concept. Referring to FIG. 3, the semiconductor light emitting device package may have a flip-chip structure, which includes a light emitting structure 100 disposed on a substrate 500. Light may be emitted through the substrate 500.

The light emitting structure 100 is disposed inside a package main body 1300, and the light emitting structure 100 is connected with a first electrode pad 1100 and a second electrode pad 1200 through a first solder bump 640 and a second solder bump 650, respectively. The first solder bump 640 may be connected with the first electrode 210, and the second solder bump 650 may be connected with the second electrode 220.

The first electrode pad 1100 supplies a first voltage, and the first voltage is transmitted to the first conductive semiconductor layer 110 of the light emitting structure 100 through the first metal layer 530. The second electrode pad 1200 supplies a second voltage, and the second voltage is transmitted to the second conductive semiconductor layer 130 through the second metal layer 540.

Since a metal reflective layer, such as the electrode layer 200, is disposed at a surface of the light emitting structure 100, light generated by the light emitting structure is reflected toward the substrate 500 by the electrode layer 200. Although FIG. 3 illustrates that the substrate 500 may be included. However, in an exemplary embodiment of the inventive concept, the substrate 500 may be omitted.

Further, a reflective material may be disposed on an inclined surface inside the package main body 1300 to increase light reflection efficiency within the package main body 1300. Further, in an exemplary embodiment of the inventive concept, the semiconductor light emitting device package may include wavelength converting particles GP inside the package main body 1300. The wavelength converting particles GP may include a wavelength converting material such as a fluorescent substance or a quantum dot. The wavelength of light emitted by the light emitting structure 100 may be adjusted by the wavelength converting particles GP depending on a composition of the wavelength converting particles GP. However, the wavelength converting particles GP may also be omitted.

Figure 4:
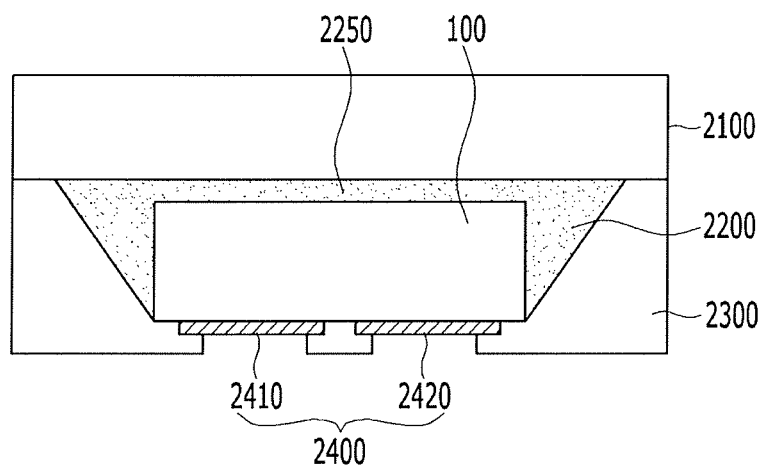
FIG. 4 is a cross-sectional view illustrating a semiconductor light emitting device package according to an exemplary embodiment of the inventive concept.
Figure 5:
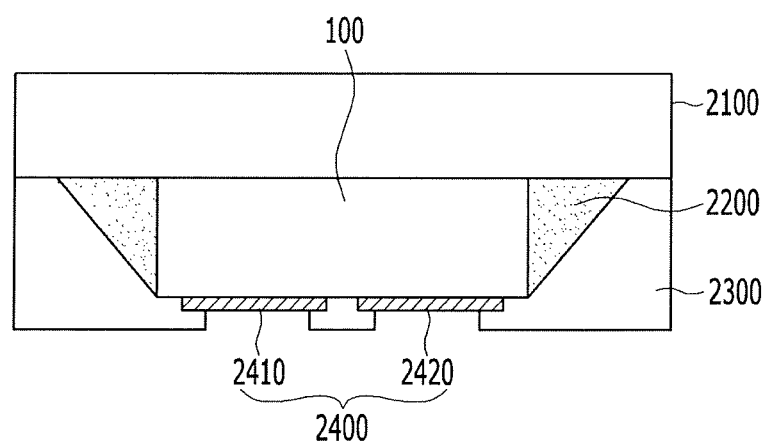
FIG. 5 is a cross-sectional view illustrating a semiconductor light emitting device package according to an exemplary embodiment of the inventive concept.

FIG. 4 is a view illustrating a semiconductor light emitting device package according to an exemplary embodiment of the inventive concept. FIG. 5 is a view illustrating a semiconductor light emitting device package according to an exemplary embodiment of the inventive concept. Referring to FIGS. 4 and 5, a semiconductor light emitting device package may be manufactured in a form of a package having approximately the same size as the size of the semiconductor light emitting device. A separate packaging process may not be required to package the semiconductor light emitting device packages of FIGS. 4 and 5 since each of the semiconductor light emitting device packages of FIGS. 4 and 5 may be ready for use as shown in FIGS. 4 and 5. In addition, the semiconductor light emitting device packages of FIGS. 4 and 5 may be small and efficient. Thus, a plurality of semiconductor light emitting device packages, as shown in FIGS. 4 and/or 5, may be arranged in a small area such that a large quantity of light may be output from a small area. Further, the semiconductor light emitting device packages of FIGS. 4 and 5 may have low manufacturing costs, a high heat resistance and a high color uniformity.

Referring to FIG. 4, a semiconductor light emitting device package includes a light emitting structure 100, an electrode unit 2400, a transmissive unit 2200, a reflecting unit 2300, and a wavelength converter 2100.

The wavelength converter 2100 is attached to the light emitting structure 100, and may be a light converting sheet including a light converting material.

The light converting sheet may be manufactured in advance before a chip scale package process, and may be a rigid or a flexible sheet manufactured in various shapes. In addition, the light converting sheet may have a uniform thickness.

The wavelength converter 2100 may include an adhesive layer or an adhesive component, and may be a sheet in which naturally cured or thermally cured silicon and fluorescent substances or quantum dots are mixed. When the wavelength converter 2100 includes an adhesive component or is attached to the light emitting structure 100 in a semi-hardened state, an attachment unit 2250 between the light emitting structure 100 and the wavelength converter 2100 may be omitted, as shown in FIG. 5.

The light emitting structure 100 included in the semiconductor light emitting device packages of FIGS. 4 and 5 is the same as the light emitting structure 100 of FIGS. 1 and 2. Thus, a detailed description thereof may be omitted for brevity.

The transmissive unit 2200 is disposed between a lateral surface of the light emitting structure 100 and the wavelength converter 2100. The transmissive unit 2200 may include a transparent resin and a scattering material, such as a fluorescent substance, in addition to the transparent resin. Further, the transmissive unit 2200 may include a light transmissive encapsulation material, such as silicon or transparent epoxy molding compound (EMC), including a transparent resin. Further, the transmissive unit 2200 may include a fluorescent material, and thus, the transmissive unit 2200 may serve as a fluorescent body. Further, the transmissive unit 2200 may also further include a scattering material.

The transmissive unit 2200 may have an exterior wall portion, of which an inner diameter is increased as being close to the wavelength converter 2100. That is, a lateral surface of the transmissive unit 2200 may be formed in an inclined form.

A part of the transmissive unit 2200 may be disposed between the light emitting structure 100 and the wavelength converter 2100 to form the adhesive unit 2250. For example, the resin included in the transmissive unit 2200 may serve as an adhesive to bond the wavelength converter 2100 and the light emitting structure 100. However, when the light emitting structure 100 is bonded in a semi-hardened state of the wavelength converter 2100, the adhesive unit 2250 may be omitted.

Figure 8:
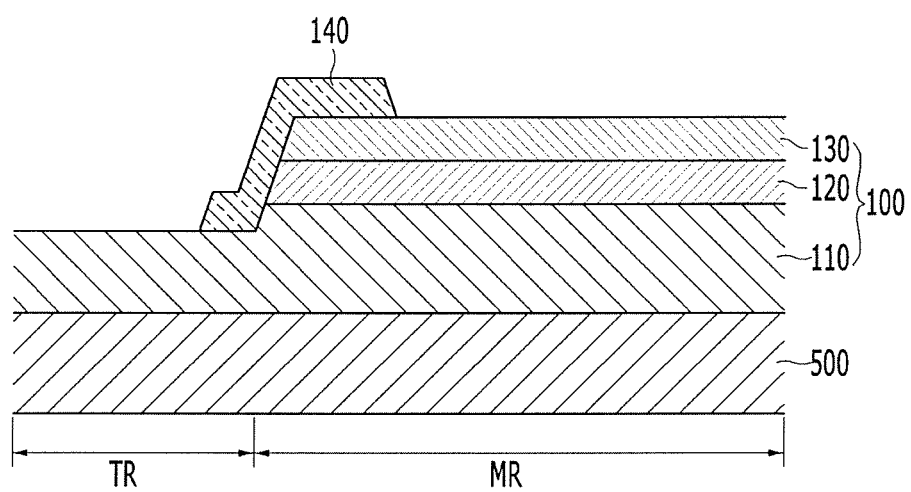

The reflecting unit 2300 is formed on the lateral surface, for example, an exterior wall portion, of the transmissive unit 2200 to reflect light emitted from the light emitting structure 100. The reflecting unit 2300 may include $TiO_2$. FIG. 8 illustrates that the part of the reflecting unit 2300 covers a lower portion of the light emitting structure 100. The reflecting unit 2300 may have a structure which does not cover the lower portion of the light emitting structure 100. In addition, the reflecting unit 2300 may also include a fluorescent substance.

FIG. 4 illustrates that a contact surface between the transmissive unit 2200 and the reflecting unit 2300 is inclined with respect to a light-emitting surface of the light emitting structure 100. However, but the contact surface between the transmissive unit 2200 and the reflecting unit 2300 may also be substantially horizontal with respect to the light-emitting surface of the light emitting structure 100.

The electrode unit 2400 is disposed between the reflecting unit 2300 and the light emitting structure 100. The electrode unit 2400 may include a first electrode 2410 and a second electrode 2420. The first electrode 2410 may be connected with one of the first and second conductive semiconductor layers 110 and 130 of the light emitting structure 100, and the second electrode 2420 may be connected with the other of the first and second conductive semiconductor layers 110 and 130 of the light emitting structure 100. Although not illustrated, a solder bump may be further disposed in the first electrode 2410 and the second electrode 2420.

As shown in FIG. 5, an attachment unit is not disposed between a wavelength converter 2100 and a light emitting structure 100. For example, as shown in FIG. 5, since the light emitting structure 100 is disposed on the wavelength converter 2100 when the wavelength converter 2100 is in a semi-hardened, a separate attachment unit is not required.

FIGS. 6 to 14 are cross-sectional views illustrating a process of manufacturing a semiconductor light emitting device according to an exemplary embodiment of the inventive concept. For example, FIGS. 6 to 14 illustrate a manufacturing process by using the cross-section of FIG. 2.

Figure 6:
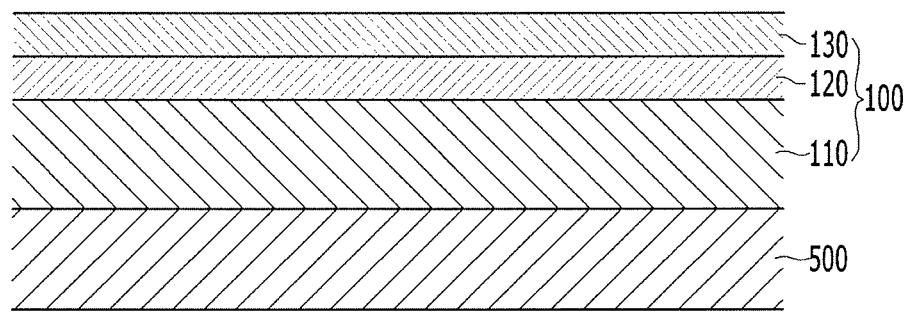
FIGS. 6 to 14 are cross-sectional views illustrating a process of manufacturing a semiconductor light emitting device according to an exemplary embodiment of the inventive concept.

Referring to FIG. 6, a light emitting structure 100 is formed by sequentially depositing a first conductive semiconductor layer 110, an active layer 120, and a second conductive semiconductor layer 130 on a substrate 500. The descriptions of the first conductive semiconductor layer 110, the active layer 120, and the second conductive semiconductor layer 130 are the same as those described above with reference to FIG. 2. Thus, a detailed description thereof will be omitted for brevity.

Figure 7:
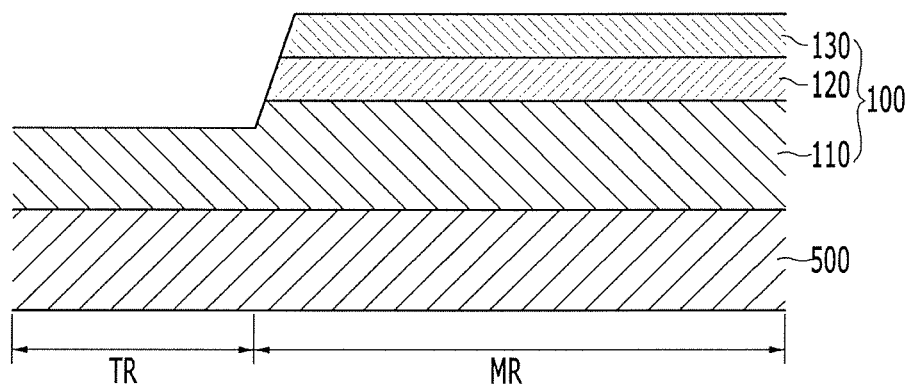

A plurality of mesa regions MR, each of which is partially divided by a trench region TR, is formed by etching a part of the light emitting structure 100 as shown in FIG. 7. An upper surface of the first conductive semiconductor layer 110 may be exposed by etching a part of the light emitting structure 100 so that the first conductive semiconductor layer 110 is etched by a depth of a partial thickness from the second conductive semiconductor layer 130. Accordingly, the trench regions TR, in which an upper surface of the first conductive semiconductor layer 110 is exposed, may be formed. The mesa region MR may be higher in elevation than the trench regions TR when measured perpendicularly from a surface of the substrate 500. In an exemplary embodiment of the inventive concept, the light emitting structure 100 may be etched by a reactive ion etching (RIE) process.

Referring to FIG. 8, a first insulating layer 140 is formed by depositing and patterning an insulating material on entire surfaces of the mesa region MR and the trench region TR. The insulating material may be deposited by a process of PECVD, PVD, CVD, or spin coating. The first insulating layer 140 may be patterned to cover a lateral surface of the light emitting structure 100 exposed in a boundary of the mesa region MR and the trench region TR.

Figure 9:
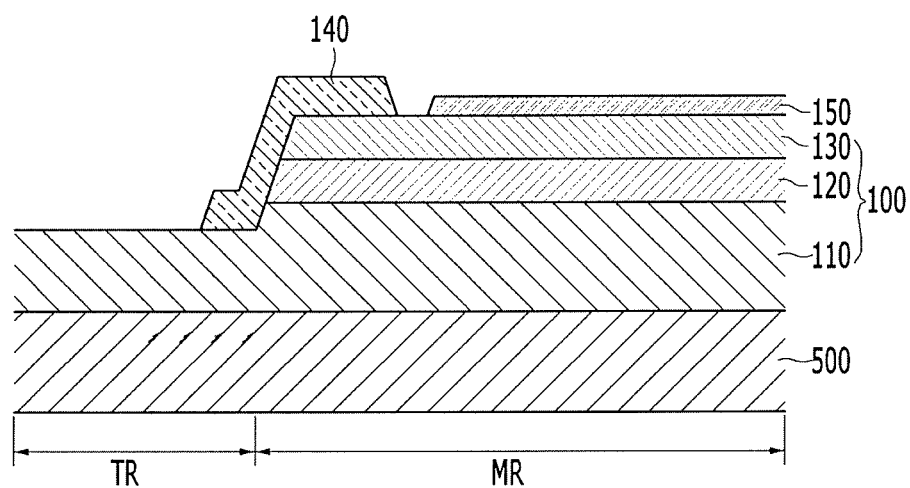

Referring to FIG. 9, a conductive layer 150 is formed on an upper surface of the second conductive semiconductor layer 130 of the mesa region MR. The conductive layer 150 may be formed by forming a conductive material layer on an entire surface of the semiconductor light emitting device and then patterning the conductive material layer. The conductive material layer may be formed by sputtering or a PECVD process.

The conductive layer 150 may include indium tin oxide (ITO), aluminum zinc oxide (AZO), indium zinc oxide (IZO), ZnO, GZO (ZnO:Ga), $In_2O_3$, $SnO_2$, CdO, $CdSnO_4$, and/or $Ga_2O_3$. Further, the conductive layer 150 may include Ag, Al, Ni, Au, Ag, Ti, Cr, Pd, Cu, Pt, Sn, W, Rh, Ir, Ru, Mg and/or Zn, and/or an alloy including at least one metal.

Figure 10:
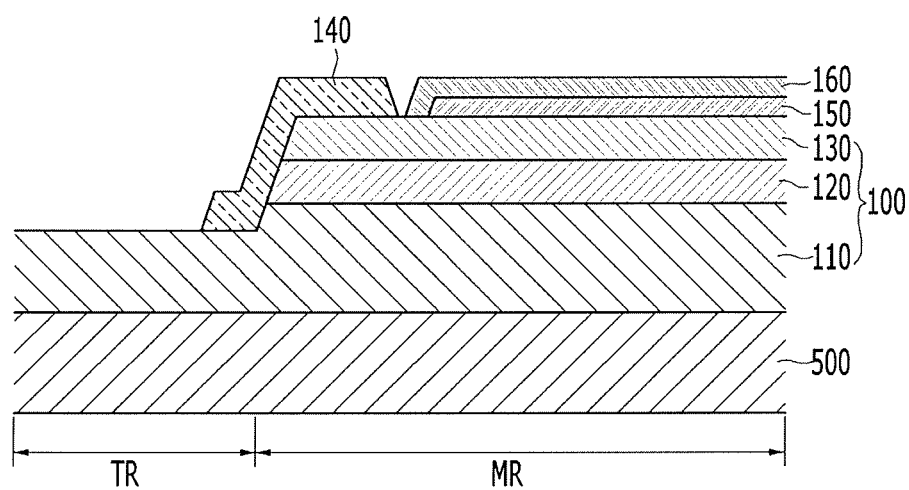

Referring to FIG. 10, a capping layer 160 is formed on the conductive layer 150. The capping layer 160 may overlap the entire conductive layer 150, and a part of the capping layer 160 may also be in contact with the second conductive semiconductor layer 130. The capping layer 160 may include an oxide such as $SiO_2$ or $TiO_2$. Alternatively, or additionally, the capping layer 160 may include a metal.

Since the capping layer 160 is formed after the conductive layer 150 is formed, the capping layer 160 covers both a front surface and a lateral surface of the conductive layer 150. Thus, the conductive layer 150 may not be peeled off from an upper surface of the second conductive semiconductor layer 130 at least due to the adhesion between the capping layer 160 and the second conductive semiconductor layer 130.

Figure 11:
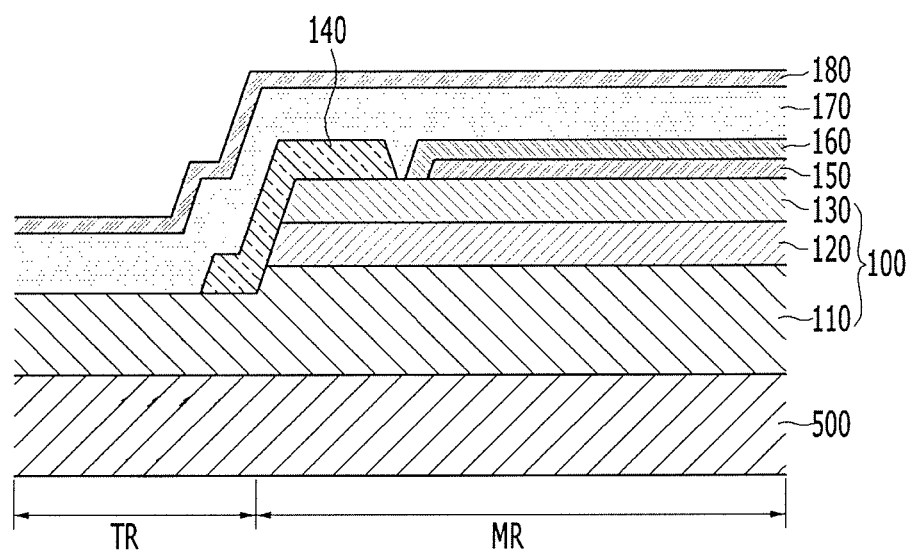

Referring to FIG. 11, a second insulating layer 170 is deposited on an entire surface of the semiconductor light emitting device. Next, an adhesive layer 180 is deposited on an entire surface of the second insulating layer 170. The second insulating layer 170 may be formed by a process of PECVD, PVD, CVD, or spin coating. The adhesive layer 180 may have a structure deposited by using plasma in the state where tin oxide ($SnO_2$) is supplied to indium oxide ($In_2O_3$). When the adhesive layer 180 is an insulating material, the adhesive layer 180 may be formed by a process of PECVD, PVD, CVD, or spin coating.

Figure 12:
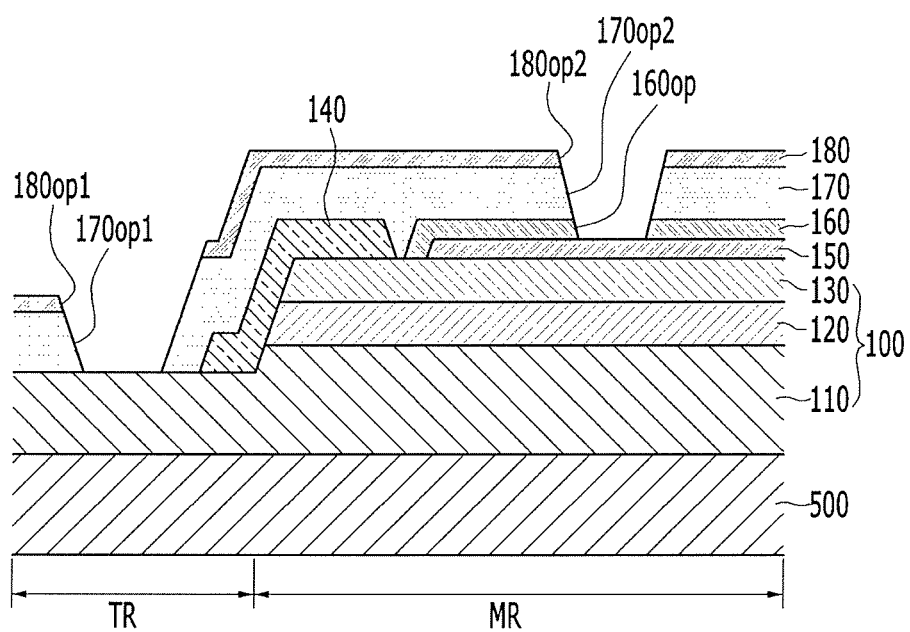

Referring to FIG. 12, a first opening 170op1 and a second opening 170op2 of the second insulating layer 170, and a first opening 180op1 and a second opening 180op2 of the adhesive layer 180 are simultaneously formed by etching the second insulating layer 170 and the adhesive layer 180 at the same time. The openings may be formed by dry etching or wet etching. The first opening 170op1 of the second insulating layer 170 may overlap the first opening 180op1 of the adhesive layer 180, and the second opening 170op2 of the second insulating layer 170 may overlap the second opening 180op2 of the adhesive layer 180.

In the present operation, since the openings of the second insulating layer 170 and the adhesive layer 180 are formed by a single process, a width of the first opening 180op1 of the adhesive layer 180 may be the same as or larger than a width of the first opening 170op1 of the second insulating layer 170. Similarly, a width of the second opening 180op2 of the adhesive layer 180 may be the same as or larger than a width of the second opening 170op2 of the second insulating layer 170. This may be because during the etching process for forming the openings, each opening has a particular width in an upper portion of the laminated layer, and the width of the opening is decreased in a direction of the etching (e.g., toward the substrate 500).

In the present operation, when the second opening 170op2 of the second insulating layer 170 and the second opening 180op2 of the adhesive layer 180 are formed, the capping layer 160, disposed between the second insulating layer 170 and the second conductive semiconductor layer 130, may be etched at the same time. Accordingly, an opening 160op may be formed in the capping layer 160, and the conductive layer 150 may be partially exposed through the opening 160op of the capping layer 160, the second opening 170op2 of the second insulating layer 170, and the second opening 180op2 of the adhesive layer 180. However, when the capping layer 160 includes a metal, the capping layer 160 is not etched, and the opening 160op may not be formed.

The second opening 170op2 of the second insulating layer 170, the second opening 180op2 of the adhesive layer 180, and the opening 160op of the capping layer 160 may overlap one another to expose the conductive layer 150. The first opening 170op1 of the second insulating layer 170 and the first opening 180op1 of the adhesive layer 180 may overlap each other to expose the first conductive semiconductor layer 110 of the trench region TR.

Figure 13:
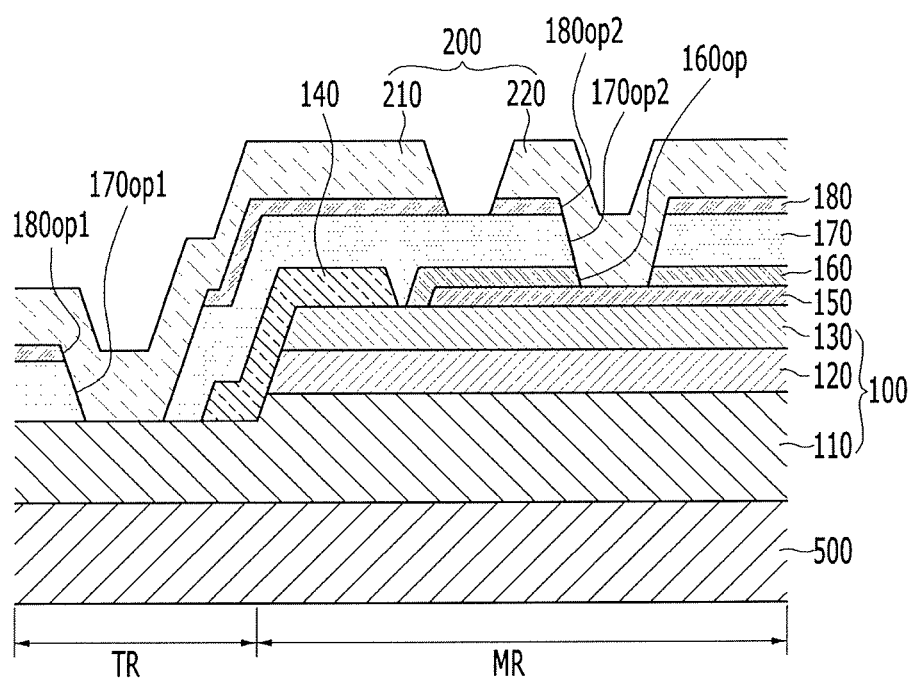

Referring to FIG. 13, a first electrode 210 and a second electrode 220, which are separated from each other, are formed by depositing a material of an electrode layer 200 on the entire surface of the semiconductor light emitting device and patterning the depositing material. During the process of forming the first electrode 210 and the second electrode 220 by pattering the electrode layer 200, the adhesive layer 180 may be removed in the region in which the first electrode 210 and the second electrode 220 are separated from each other.

The electrode layer 200 may include a single layer including a single material selected from Au, Sn, Ni, Pb, Ag, In, Cr, Ge, Si, Ti, W and Pt, or an alloy including two or more materials selected from Au, Sn, Ni, Pb, Ag, In, Cr, Ge, Si, Ti, W and Pt. The electrode layer 200 may also include multiple layers including a combination of Au, Sn, Ni, Pb, Ag, In, Cr, Ge, Si, Ti, W and Pt.

The first electrode 210 may be disposed within the first opening 180op1 of the adhesive layer 180 and the first opening 170op1 of the second insulating layer 170 to be in contact with the first conductive semiconductor layer 110. The first electrode 210 may be in contact with an entire surface of a lateral wall of the first opening 170op1 of the second insulating layer 170.

The second electrode 220 may be disposed within the second opening 180op2 of the adhesive layer 180 and the second opening 170op2 of the second insulating layer 170 to be in contact with the conductive layer 150. The second electrode 220 may be in contact with an entire surface of a lateral wall of the second opening 170op2 of the second insulating layer 170. As illustrated in FIG. 1, a first metal layer 530, which is in contact with the first electrode 210, and a second metal layer 540, which is in contact with the second electrode 220 may also be further formed.

Figure 14:
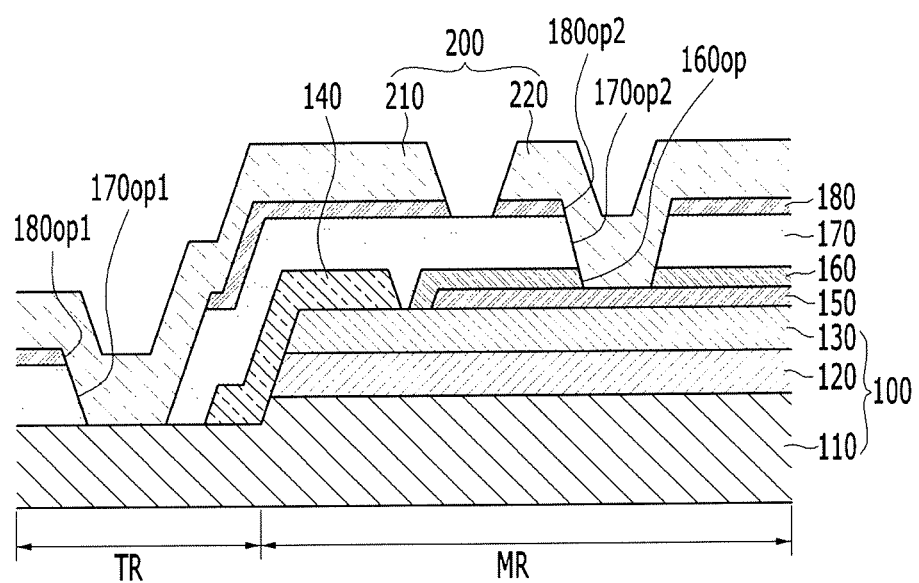

Referring to FIG. 14, the substrate 500 is removed. The substrate 500 may be removed by a laser lift off process or a chemical lift off process. However, operation of removing the substrate 500 is optional and may be omitted.

As described above, in a method of manufacturing the semiconductor light emitting device according to an exemplary embodiment of the inventive concept, the openings 180op1, 180op2, 170op1, 170op2 and 160op are simultaneously formed after the second insulating layer 170 and the adhesive layer 180 are laminated. Thus, process operations for forming the openings 180op1, 180op2, 170op1, 170op2 and 160op at different times are reduced. Accordingly, the method of FIGS. 6 to 14 is cost efficient. Further, since the adhesive layer 180 is not formed within the openings 170op1, 170op2 of the second insulating layer 170, an insulating material, as well as a conductive material, may be included in the adhesive layer 180. The adhesive layer 180, including an insulating material, may decrease re-absorption of the light generated in the active layer 120. In addition, the adhesive layer 180 may reflect light emitted from the light emitting structure 100 together with the second insulating layer 170 by a difference of a refractive index between the adhesive layer 180 and the second insulating layer 170. Thus, the efficiency of the semiconductor light emitting device may be increased.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor light emitting device, comprising:
a light emitting structure in which a first conductive semiconductor layer, an active layer, and a second conductive semiconductor layer are sequentially laminated;
an insulating layer disposed on the light emitting structure, the insulating layer including a first opening and a second opening;
an electrode layer disposed on the insulating layer, the electrode layer including a first electrode and a second electrode; and
an adhesive layer disposed between the electrode layer and the insulating layer, wherein the adhesive layer includes a first opening and a second opening,
wherein the first opening of the adhesive layer overlaps the first opening of the insulating layer, and a width of the first opening of the adhesive layer is equal to or larger than a width of the first opening of the insulating layer, and
wherein the second opening of the adhesive layer overlaps the second opening of the insulating layer, and a width of the second opening of the adhesive layer is equal to or larger than a width of the second opening of the insulating layer.

2. The semiconductor light emitting device of claim 1, wherein a first electrode is disposed in the first opening of the adhesive layer and in the first opening of the insulating layer, and an entire surface of the first opening of the insulating layer is in contact with the first electrode, and
wherein a second electrode is disposed in the second opening of the adhesive layer and in the second opening of the insulating layer, and an entire surface of the second opening of the insulating layer is in contact with the second electrode.

3. The semiconductor light emitting device of claim 1, wherein a surface of the first opening of the insulating layer is not in contact with the adhesive layer, and a surface of the second opening of the insulating layer is not in contact with the adhesive layer.

4. The semiconductor light emitting device of claim 1, further comprising a conductive layer disposed between the second conductive semiconductor layer and the insulating layer.

5. The semiconductor light emitting device of claim 4, further comprising a capping layer disposed between the conductive layer and the insulating layer,
wherein the capping layer includes an opening, and
wherein the opening of the capping layer overlaps the second opening of the insulating layer and the second opening of the adhesive layer.

6. The semiconductor light emitting device of claim 5, wherein the first electrode is in contact with the first conductive semiconductor layer through the first opening of the adhesive layer and the first opening of the insulating layer, and
wherein the second electrode is in contact with the conductive layer through the first opening of the adhesive layer, the first opening of the insulating layer, and the opening of the capping layer.

7. The semiconductor light emitting device of claim 1, wherein the adhesive layer includes an insulating material.

8. The semiconductor light emitting device of claim 7, wherein a thickness of the adhesive layer is about 1 Å to about 1,000 Å.

9. The semiconductor light emitting device of claim 7, wherein the adhesive layer includes an insulating material having a lower refractive index than a refractive index of the insulating layer.

10. A method of manufacturing a semiconductor light emitting device, comprising:
forming a light emitting structure by sequentially laminating a first conductive semiconductor layer, an active layer and a second conductive semiconductor layer;
etching a part of the light emitting structure such that the first conductive semiconductor layer is exposed;
forming an insulating layer on the light emitting structure;
forming an adhesive layer on the insulating layer;
forming a first opening in the insulating layer, a second opening in the insulating layer, a first opening in the adhesive layer and a second opening in the adhesive layer by simultaneously etching the insulating layer and the adhesive layer; and
forming an electrode layer on the adhesive layer, the electrode layer including a first electrode and a second electrode.

11. The method of claim 10, wherein the first opening of the adhesive layer overlaps the first opening of the insulating layer, and a width of the first opening of the adhesive layer is equal to or larger than a width of the first opening of the insulating layer, and
wherein the second opening of the adhesive layer overlaps the second opening of the insulating layer, and a width of the second opening of the adhesive layer is equal to or larger than a width of the second opening of the insulating layer.

12. The method of claim 10, wherein a first electrode is formed in the first opening of the adhesive layer and in the first opening of the insulating layer, and an entire surface of the first opening of the insulating layer is in contact with the first electrode, and
wherein a second electrode is disposed in the second opening of the adhesive layer and in the second opening of the insulating layer, and an entire surface of the second opening of the insulating layer is in contact with the second electrode.

13. The method of claim 10, further comprising:
forming a conductive layer on the second conductive semiconductor layer; and
forming a capping layer on the conductive layer,
wherein the forming of the conductive layer and the capping layer occurs after the etching of the part of the light emitting structure and the forming of the insulating layer.

14. The method of claim 13, wherein the the forming of the first opening in the insulating layer, the second opening in the insulating layer, the first opening in the adhesive layer and the second opening in the adhesive layer further includes forming an opening of the capping layer simultaneously with the forming of the first opening in the insulating layer, the second opening in the insulating layer, the first opening in the adhesive layer and the second opening in the adhesive layer, and
wherein the opening of the capping layer overlaps the second opening of the insulating layer and the second opening of the adhesive layer.

15. The method of claim 14, wherein the first electrode is in contact with the first conductive semiconductor layer through the first opening of the adhesive layer and the first opening of the insulating layer, and
wherein the second electrode is in contact with the conductive layer through the second opening of the adhesive layer, the second opening of the insulating layer, and the opening of the capping layer.

16. A semiconductor light emitting device, comprising:
a first conductive semiconductor layer, an active layer, and a second conductive semiconductor layer stacked on each other;
an electrode layer disposed on the second conductive semiconductor layer, the electrode layer including a first electrode and a second electrode, wherein the first and second electrodes are spaced apart from each other;
an insulating layer disposed between the second conductive semiconductor layer and the electrode layer, wherein the insulating layer includes a first opening and a second opening; and
an adhesive layer disposed between the electrode layer and the insulating layer, wherein the adhesive layer includes a first opening and a second opening,
wherein the first opening of the adhesive layer overlaps the first opening of the insulating layer,
wherein the second opening of the adhesive layer overlaps the second opening of the insulating layer, and
wherein the second insulating layer has a refractive index that is lower than a refractive index of the second conductive semiconductor layer.

17. The semiconductor light emitting device of claim 16, wherein the adhesive layer has a refractive index that is lower than a refractive index of the insulating layer.

18. The semiconductor light emitting device of claim 16, wherein the adhesive layer includes $SiO_2$ or $TiO_2$.

19. The semiconductor light emitting device of claim 16, wherein the first electrode is electrically connected with the first conductive semiconductor layer through the first opening of the adhesive layer and the first opening of the insulating layer, and
wherein the second electrode is electrically connected with the second conductive semiconductor layer through the second opening of the adhesive layer and second first opening of the insulating layer.

20. The semiconductor light emitting device of claim 16, wherein the first conductive semiconductor layer includes a first surface and a second surface opposite to the first surface,
wherein the active layer is disposed on the first surface, and
wherein a first distance, measured perpendicularly from the second surface to an uppermost surface of the first electrode at the first opening of the insulating layer, is smaller than a second distance, measured perpendicularly from the second surface to an uppermost surface of the second electrode at the second opening of the adhesive layer.

* * * * *